United States Patent
Yamaguchi et al.

(10) Patent No.: US 6,560,109 B2
(45) Date of Patent: May 6, 2003

(54) STACK OF MULTILAYER MODULES WITH HEAT-FOCUSING METAL LAYER

(75) Inventors: James Satsuo Yamaguchi, Laguna Niguel, CA (US); Angel Antonio Pepe, Irvine, CA (US); Volkan H. Ozguz, Aliso Viejo, CA (US); Andrew Nelson Camien, Costa Mesa, CA (US)

(73) Assignee: Irvine Sensors Corporation, Costa Mesa, CA (US)

(*) Notice: Subject to any disclaimer, the term of this patent is extended or adjusted under 35 U.S.C. 154(b) by 0 days.

(21) Appl. No.: 09/949,024

(22) Filed: Sep. 7, 2001

(65) Prior Publication Data

US 2003/0048609 A1 Mar. 13, 2003

(51) Int. Cl.[7] .................................................. H05K 7/20
(52) U.S. Cl. ........................ 361/704; 361/705; 361/707; 361/708; 361/710; 361/790; 361/735; 257/686; 257/706; 257/712
(58) Field of Search ................................ 156/264, 295; 174/252; 257/777, 686, 683; 361/735, 744, 704–705, 707–708, 709–710, 790, 803; 438/109, 249

(56) References Cited

U.S. PATENT DOCUMENTS

| | | |
|---|---|---|
| 4,617,160 A | 10/1986 | Belanger et al. |
| 4,704,319 A | 11/1987 | Belanger et al. |
| 4,706,166 A | 11/1987 | Go |
| 4,764,846 A | 8/1988 | Go |
| 4,983,533 A | 1/1991 | Go |
| 5,104,820 A | 4/1992 | Go et al. |
| 5,250,843 A | 10/1993 | Eichelberger |
| 5,279,991 A | 1/1994 | Minahan et al. |
| 5,347,428 A | 9/1994 | Carson et al. |
| 5,424,920 A | 6/1995 | Miyake |
| 5,432,318 A | 7/1995 | Minahan |
| 5,432,729 A | 7/1995 | Carson et al. |
| 5,581,498 A | 12/1996 | Ludwig et al. |
| 5,635,010 A | 6/1997 | Pepe et al. |
| 5,688,721 A | 11/1997 | Johnson |
| 5,699,234 A | * 12/1997 | Sais et al. .................. 361/790 |
| 5,701,233 A | 12/1997 | Carson et al. |
| 5,841,193 A | 11/1998 | Eichelberger |
| 5,953,588 A | 9/1999 | Camien et al. |
| 6,014,316 A | 1/2000 | Eide |
| 6,028,352 A | 2/2000 | Eide |

* cited by examiner

Primary Examiner—Gregory Thompson
(74) Attorney, Agent, or Firm—Myers Dawes & Andras; Joseph C. Andras; Vic Y. Lin

(57) ABSTRACT

A stack of multilayer modules has a segmentation layer disposed between neighboring multilayer modules. The segmentation layer facilitates the separation of neighboring multilayer modules. The stack of multilayer modules includes a first multilayer module and a second multilayer module. Each multilayer module includes a plurality of active layers each comprising a substrate, at least one electronic element, and a plurality of electrically-conductive traces. The second multilayer module is disposed to be neighboring the first multilayer module with at least one segmentation layer between the first and second multilayer modules. The segmentation layer includes a metal layer and at least one thermoplastic adhesive layer. When heat is applied, the metal layer conducts heat to the thermoplastic adhesive layer.

10 Claims, 11 Drawing Sheets

US 6,560,109 B2

STACK OF MULTILAYER MODULES WITH HEAT-FOCUSING METAL LAYER

BACKGROUND OF THE INVENTION

1. Field of the Invention

This invention relates to the field of electronics packaging, and in particular, to high-density electronic modules for housing and interconnecting electronic components located on stacked substrate layers.

2. Description of the Related Art

Increasing the volume density of electronic packaging is crucial for reducing device sizes for a given functionality. Efforts to provide high-density electronic packaging have included three-dimensional stacking technology in an attempt to avoid the inherent geometric constraints of standard two-dimensional semiconductor integrated circuits ("ICs"). By stacking electronic modules on top of one another and providing interconnections between the modules, the multiple layers can provide additional circuit elements without extending the two-dimensional footprint beyond that of a single module. Certain embodiments have also included heat-conducting, electrically insulating layers to improve heat dissipation during operation of these stacked electronic modules.

Numerous packaging schemes have been developed for stacking silicon-based ICs to increase the volume densities of electronic devices. However, while the silicon wafers of the silicon-based ICs provide rigidity and stability for the electronic elements, the ultimate volume densities of the multilayer stacks are inherently limited due to the thicknesses of the silicon wafers. Lapping off excess silicon from the back side of silicon wafers before stacking has been used to decrease the thickness of the silicon layers, and hence increase the number of layers per unit height. However, this procedure is time-consuming and requires precise machining to avoid damaging the circuit elements.

SUMMARY OF THE INVENTION

In accordance with one aspect of an embodiment of the invention, a stack of multilayer modules has a segmentation layer disposed between neighboring multilayer modules. The segmentation layer facilitates the separation of neighboring multilayer modules. The stack of multilayer modules comprises a first multilayer module comprising a plurality of active layers each comprising a substrate, at least one electronic element, and a plurality of electrically-conductive traces. The stack of multilayer modules further comprises a second multilayer module comprising a plurality of active layers each comprising a substrate, at least one electronic element, and a plurality of electrically-conductive traces. The second multilayer module is disposed to be neighboring the first multilayer module. The stack of multilayer modules further comprises at least one segmentation layer between the first and second multilayer modules. The segmentation layer comprises a metal layer and at least one thermoplastic adhesive layer. When heat is applied, the metal layer conducts heat to the thermoplastic adhesive layer.

In accordance with another aspect of an embodiment of the invention, a method releasably adheres together neighboring multilayer modules of a stack of multilayer modules. The method comprises providing a first multilayer module comprising a plurality of active layers each comprising a substrate, at least one electronic element, and a plurality of electrically-conductive traces. The method further comprises providing a second multilayer module comprising a plurality of active layers each comprising a substrate, at least one electronic element, and a plurality of electrically-conductive traces. The second multilayer module is disposed to be neighboring the first multilayer module. The method further comprises disposing a segmentation layer between the first multilayer module and second multilayer module. The segmentation layer comprises a metal layer and a thermoplastic adhesive layer. When heat is applied, the metal layer conducts heat to the thermoplastic adhesive layer.

In accordance with another aspect of an embodiment of the invention, each multilayer module of a stack of multilayer modules has a plurality of layers wherein each layer has a substrate therein. The stack of multilayer modules comprises a first multilayer module comprising a first layer having a top side and bottom side. The first layer comprises a substrate, at least one electronic element, and a plurality of electrically-conductive traces. The stack of multilayer modules further comprises a second multilayer module comprising a second layer having a top side and bottom side. The second layer comprises a substrate, at least one electronic element, and a plurality of electrically-conductive traces. The stack of multilayer modules further comprises a metal layer disposed between and adhered to the top side of the first layer and the bottom side of the second layer. The first multilayer module is releasably adhered to the second multilayer module.

In accordance with another aspect of an embodiment of the invention, a method provides a stack of multilayer modules. Each multilayer module has a plurality of layers wherein each layer has a substrate therein. The method comprises providing a first multilayer module comprising a first layer having a top side and bottom side. The first layer comprises a substrate, at least one electronic element, and a plurality of electrically-conductive traces. The method further comprises providing a second multilayer module comprising a second layer having a top side and bottom side. The second layer comprises a substrate, at least one electronic element, and a plurality of electrically-conductive traces. The method further comprises adhering a metal layer to the top side of the first layer and the bottom side of the second layer. The method further comprises releasably adhering the first multilayer module to the second multilayer module with the metal layer disposed between the first multilayer module and the second multilayer module.

In accordance with another aspect of an embodiment of the invention, each multilayer module of a stack of multilayer modules has a plurality of layers wherein each layer has a substrate therein. The plurality of multilayer modules comprises a first multilayer module comprising a first layer having a top side and bottom side. The first layer comprises a substrate, at least one electronic element, and a plurality of electrically-conductive traces. The plurality of multilayer modules further comprises a second multilayer module comprising a second layer having a top side and bottom side. The second layer comprises a substrate, at least one electronic element, and a plurality of electrically-conductive traces. The plurality of multilayer modules further comprises a thermoplastic adhesive disposed between the top side of the first layer and the bottom side of the second layer. The first multilayer module is releasably adhered to the second multilayer module.

In accordance with another aspect of an embodiment of the invention, a method provides a stack of multilayer modules. Each multilayer module has a plurality of layers wherein each layer has a substrate therein. The method comprises providing a first multilayer module comprising a first layer having a top side and bottom side. The first layer comprises a substrate, at least one electronic element, and a plurality of electrically-conductive traces. The method further comprises providing a second multilayer module comprising a second layer having a top side and bottom side. The second layer comprises a substrate, at least one electronic element, and a plurality of electrically-conductive traces. The method further comprises releasably adhering the first multilayer module to the second multilayer module by disposing a thermoplastic adhesive between the top side of the first layer and the bottom side of the second layer.

In accordance with another aspect of an embodiment of the invention, a stack of multilayer modules has a segmentation layer disposed between neighboring multilayer modules. The segmentation layer facilitates the separation of neighboring multilayer modules. The stack of multilayer modules comprises a first multilayer module comprising a plurality of active layers each comprising a substrate, at least one electronic element, and a plurality of electrically-conductive traces. The stack of multilayer modules further comprises a second multilayer module comprising a plurality of active layers each comprising a substrate, at least one electronic element, and a plurality of electrically-conductive traces. The second multilayer module is disposed to be neighboring the first multilayer module. The stack of multilayer modules further comprises at least one segmentation layer between the first and second multilayer modules. The segmentation layer comprises a plurality of metal layers and at least one thermoplastic adhesive layer. When heat is applied, the metal layers conducts heat to the thermoplastic adhesive layer.

In accordance with another aspect of an embodiment of the invention, a method provides a stack of multilayer modules with a segmentation layer disposed between neighboring multilayer modules. The method comprises providing a first multilayer module comprising a plurality of active layers each comprising a substrate, at least one electronic element, and a plurality of electrically-conductive traces. The method further comprises providing a second multilayer module comprising a plurality of active layers each comprising a substrate, at least one electronic element, and a plurality of electrically-conductive traces. The second multilayer module is disposed to be neighboring the first multilayer module. The method further comprises releasably adhering the first multilayer module and the second multilayer module by disposing at least one segmentation layer between the first and second multilayer modules. The segmentation layer comprises a plurality of metal layers and at least one thermoplastic adhesive layer. When heat is applied, the metal layers conducts heat to the thermoplastic adhesive layer.

In accordance with another aspect of an embodiment of the invention, a stack of multilayer modules has a segmentation layer disposed between neighboring multilayer modules. The segmentation layer facilitates the separation of neighboring multilayer modules. The stack of multilayer modules comprises a first multilayer module comprising a first active layer comprising a substrate, at least one electronic element, and a plurality of electrically-conductive traces. The stack of multilayer modules further comprises a second multilayer module comprising a second active layer comprising a substrate, at least one electronic element, and a plurality of electrically-conductive traces. The second active layer is disposed to be neighboring the first active layer. The stack of multilayer modules further comprises at least one segmentation layer between the first and second active layers. The segmentation layer comprises a metal layer and at least one thermoplastic adhesive layer. When heat is applied, the metal layer conducts heat to the thermoplastic adhesive layer.

In accordance with another aspect of an embodiment of the invention, a method separates a stack of releasably adhered multilayer modules. The method comprises providing a first multilayer module releasably adhered to a second multilayer module by disposing a heat-separating layer between the first and second multilayer modules. The first multilayer module comprises a first layer with a substrate, at least one electronic element, and a plurality of electrically-conductive traces. The second multilayer module comprises a second layer with a substrate, at least one electronic element, and a plurality of electrically-conductive traces. The method further comprises applying heat to the heat-separating layer, thereby releasing the first multilayer module from the second multilayer module. The method further comprises separating the first multilayer module from the second multilayer module.

In accordance with another aspect of an embodiment of the invention, a stack of multilayer modules comprises means for stacking the multilayer modules. The stack of multilayer modules further comprises means for releasably adhering neighboring multilayer modules to one another upon heating. The stack of multilayer modules further comprises means for conducting heat to said means for releasably adhering neighboring multilayer modules to one another.

For the purposes of summarizing the invention, certain aspects, advantages and novel features of the invention have been described herein above. It is to be understood, however, that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF THE PREFERRED EMBODIMENT

Figure 1A:
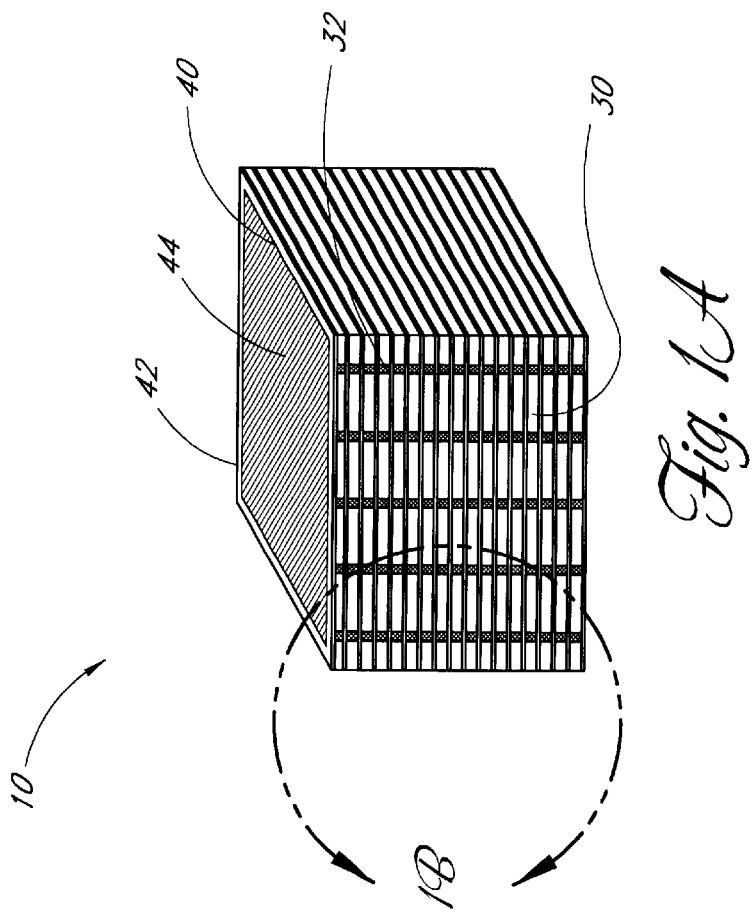
FIGS. 1A and 1B schematically illustrates a multilayer module compatible with an embodiment of the invention having a top layer and a bottom layer.
Figure 1B:
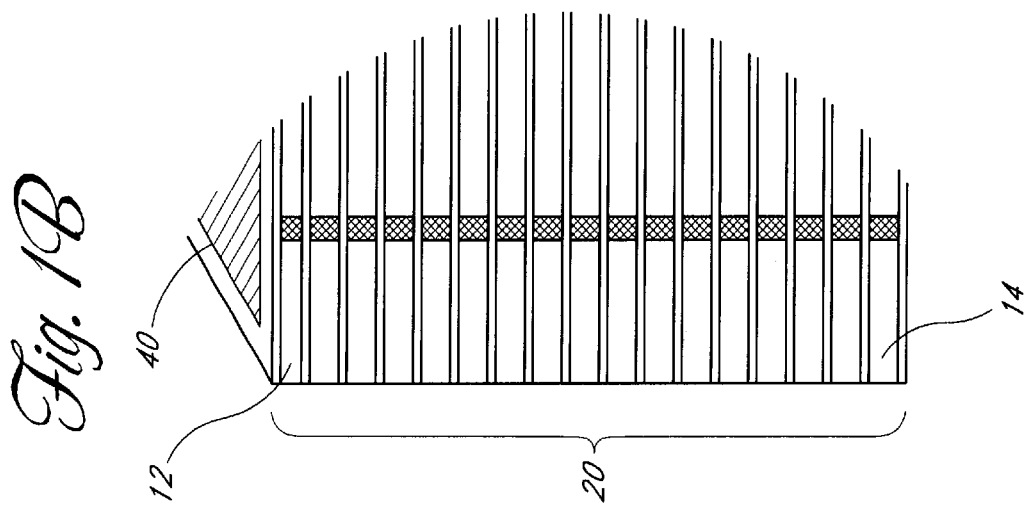
Figure 2:
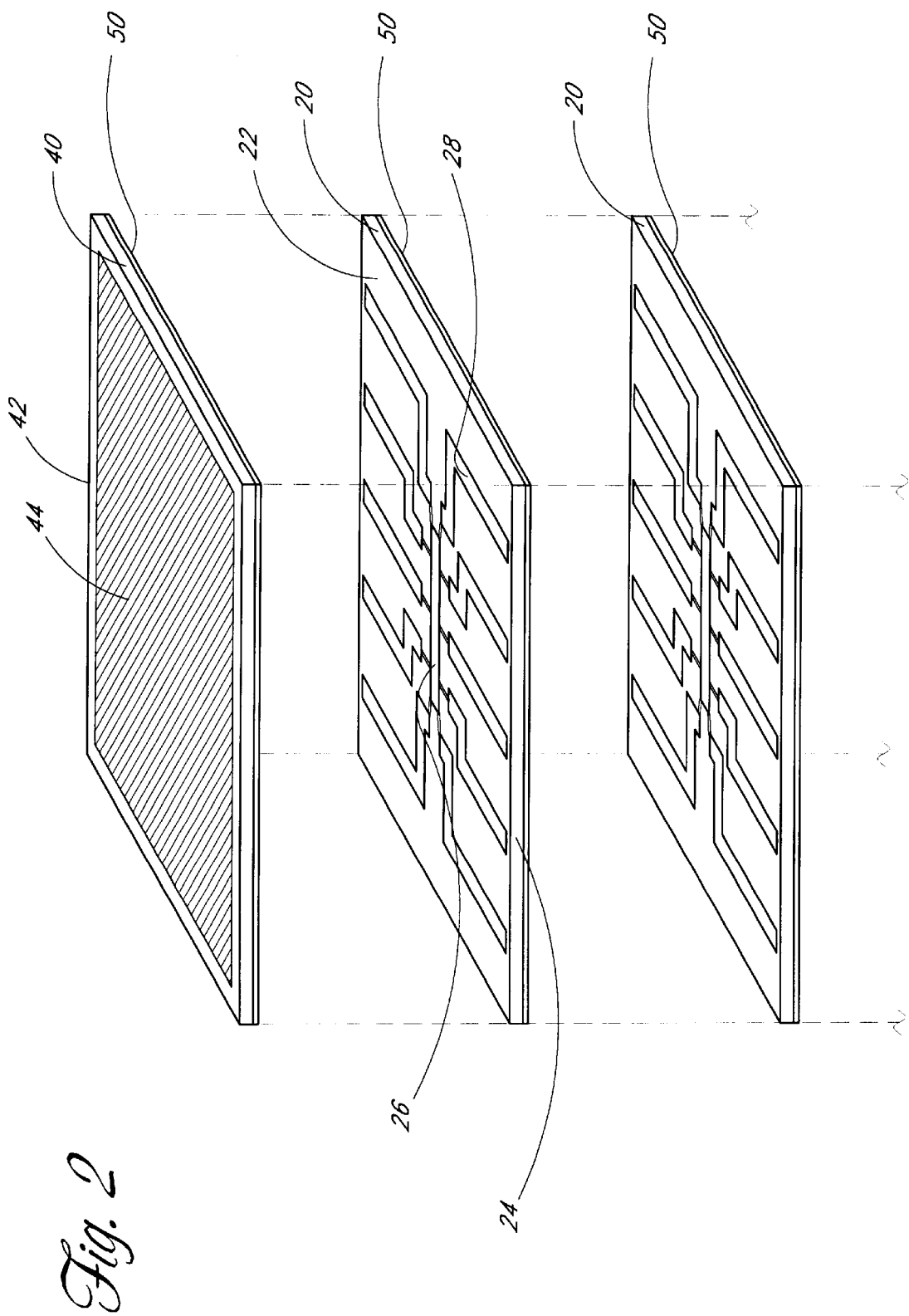
FIG. 2 schematically illustrates a partial exploded view of the multilayer module schematically illustrated in FIG. 1.

FIGS. 1 and 2 schematically illustrate a multilayer module 10 compatible with an embodiment of the invention having a top layer 12 and a bottom layer 14. FIG. 2 is a partial exploded view of the multilayer module 10 schematically illustrated in FIG. 1. The multilayer module 10 comprises a plurality of flexible active layers 20. Each active layer 20 comprises a non-electrically-conductive first substrate 22 with an edge 24, at least one electronic element 26, and a plurality of electrically-conductive traces 28 which provide electrical connection from the edge 24 of the first substrate 22 to the electronic element 26. The active layers 20 are laminated together so that the edges 24 of the first substrates 22 form a side 30 of the multilayer module 10 and the traces 28 of the active layers 20 are aligned in registry with one another.

The multilayer module 10 further comprises a plurality of electrically-conductive lines 32 along the side 30 of the multilayer module 10, the lines 32 providing electrical connection to the traces 28. The multilayer module 10 further comprises at least one flexible segmentation layer 40 laminated to the active layers 20. The segmentation layer 40 comprises a non-electrically-conductive second substrate 42 and a thermally-conductive material 44. The segmentation layer 40 is either the top layer 12 or the bottom layer 14 of the multilayer module 10. The embodiment illustrated in FIGS. 1 and 2 has a segmentation layer 40 as the top layer 12 with the thermally-conductive material 44 on the outward top surface of the multilayer module 10.

In one embodiment of the invention, the non-electrically-conductive first substrate 22 of each active layer 20 comprises a polymeric material. Examples of suitable polymeric materials for the first substrate 22 include, but are not limited to, polyimide film such as Kapton®, which is available from E.I. du Pont de Nemours and Company of Wilmington, Del., or a benzocyclobutene (BCB)-based polymer dielectric such as Cyclotene®, which is available from Dow Chemical Company of Midland, Mich.

The dimensions of the active layers 20 are not critical but are dependent on the desired functionality and packaging size constraints for the multilayer module 10. In the embodiment illustrated in FIGS. 1 and 2, the active layers 20 are approximately 1"×1" and 0.002" thick. In other embodiments, the thickness of the active layers 20 is preferably between approximately 0.0005" to approximately 0.006", more preferably between approximately 0.0005" to approximately 0.005", and most preferably between approximately 0.0005" to approximately 0.003".

The electronic element 26 of each active layer 20 comprises a polymeric material which is appropriately doped and patterned, typically by photolithographic techniques, to form conductors, insulators, diodes, transistors, memory cells, or other electronic components of the electronic element 26. In certain embodiments, the electronic element 26 can be formed within the first substrate 22 by modification of certain regions of the first substrate 22 by doping or other techniques. In certain other embodiments, the electronic element 26 can be formed on a top side of the active layer 20, or a bottom side of the active layer 20, or on both the top and bottom sides of the active layer 20.

The electrically-conductive traces 28 of each active layer 20 can comprise metallization or a conductive polymeric material, which is patterned onto the first substrate 22. The electrically-conductive traces 28 provide electrical connection between the electronic element 26 and an edge 24 of the first substrate 22. Additionally, in embodiments in which the traces 28 comprise a conductive polymeric material, the traces 28 can be formed within the first substrate 22 by modification of certain regions of the first substrate 22 by doping or other techniques.

As will be described more fully below, the active layers 20 are laminated and held together by an adhesive 50 applied to one or both sides of the active layer 20. In certain embodiments, the bottom side of one active layer 20 is adhered to the top side of another active layer 20. In certain embodiments, the thickness of the combination of two active layers 20 is preferably less than or equal to approximately 0.005", and more preferably between approximately 0.001" and approximately 0.005".

The number of active layers 20 depends on the desired functionality and packaging size constraints for the multilayer module 10. However, the upper limit on the number of active layers 20 which can comprise a multilayer module 10 is effectively limitless. For the embodiment illustrated in FIGS. 1 and 2, the multilayer module 10 comprises 16 active layers 20. In certain embodiments, the active layers 20 are substantially similar to one another and are laminated in registry with one another so that the traces 28 of each active layer 20 are aligned with the corresponding traces 28 of the other active layers 20. In such an embodiment, each active layer 20 can differ from the other active layers 20 by each having a uniquely positioned trace 28 corresponding to an enable bit of the electronic element 26. This registry between the active layers 20 simplifies the process of providing outside interconnects to the electronic elements 26 of the multilayer modules 10, as described below.

The active layers 20 are laminated together so that the edges 24 of the first substrates 22 form the electrical contact sides 30 of the multilayer module 10. At least one side 30 of the multilayer module 10 is formed by edges 24 which have the electrically-conductive traces 28. Such sides 30 have electrically-conductive lines 32 to provide electrical connection to the electronic element 26 of the active layers 20 via the traces 28. As described more fully below, in certain embodiments, the lines 32 are deposited metallization which extend across the side 30 of the multilayer module 10, electrically connecting similar traces 28 of the various active layers 20. Examples of suitable metallizations for the lines 32 include, but are not limited to, gold over titanium, gold over tungsten, copper, and nickel.

The multilayer module 10 further comprises at least one flexible segmentation layer 40 comprising a non-electrically-conductive second substrate 42 and a thermally-conductive material 44. The second substrate 42 of the segmentation layer 40 can comprise a polymeric material. Examples of suitable polymeric materials for the second substrate 42 include, but are not limited to, Kapton®, Cyclotene®, and Zenite® liquid crystal polymer (LCP) resin, which is available from E.I. du Pont de Nemours and Company of Wilmington, Del. In certain embodiments, the second substrate 42 of the segmentation layer 40 comprises the same polymeric material as do the first substrates 22 of the active layers 20. In addition, the segmentation layer 40 can have generally the same dimensions as do the active layers 20. In certain embodiments, the segmentation layer 40 is the top layer 12 of the multilayer module 10 as illustrated in FIGS. 1 and 2. In other embodiments, the segmentation layer 40 is the bottom layer 14 of the multilayer module 10. In still other embodiments, the multilayer module 10 may have segmentation layers 40 as both the top layer 12 and the bottom layer 14.

The thermally-conductive material 44 is typically a metallic sheet deposited onto one surface of the second substrate 42 of the segmentation layer 40. Other configurations of the thermally-conductive material 44, such as a grid, are also compatible with an embodiment of the invention. Examples of suitable thermally-conductive materials 44 include, but are not limited to, metals or metal alloys such as copper, aluminum, and nickel, semiconductors such as silicon, silicon carbide, and diamond, and other materials such as aluminum nitride. In certain embodiments, the thermally-conductive material 44 is a copper-clad layer approximately 0.35 mils thick deposited onto the second substrate 42. As described more fully below, in one embodiment, the thermally-conductive material 44 does not extend to the edges of the second substrate 42.

The segmentation layer 40 is laminated onto the active layers 20 with the thermally-conductive material 44 as the outermost surface. As is described more fully below, the segmentation layer 40 is laminated and held onto the active layers 20 by an adhesive 50 between the surface opposite the thermally-conductive material 44 of the second substrate 42 and an active layer 20.

Figure 3:
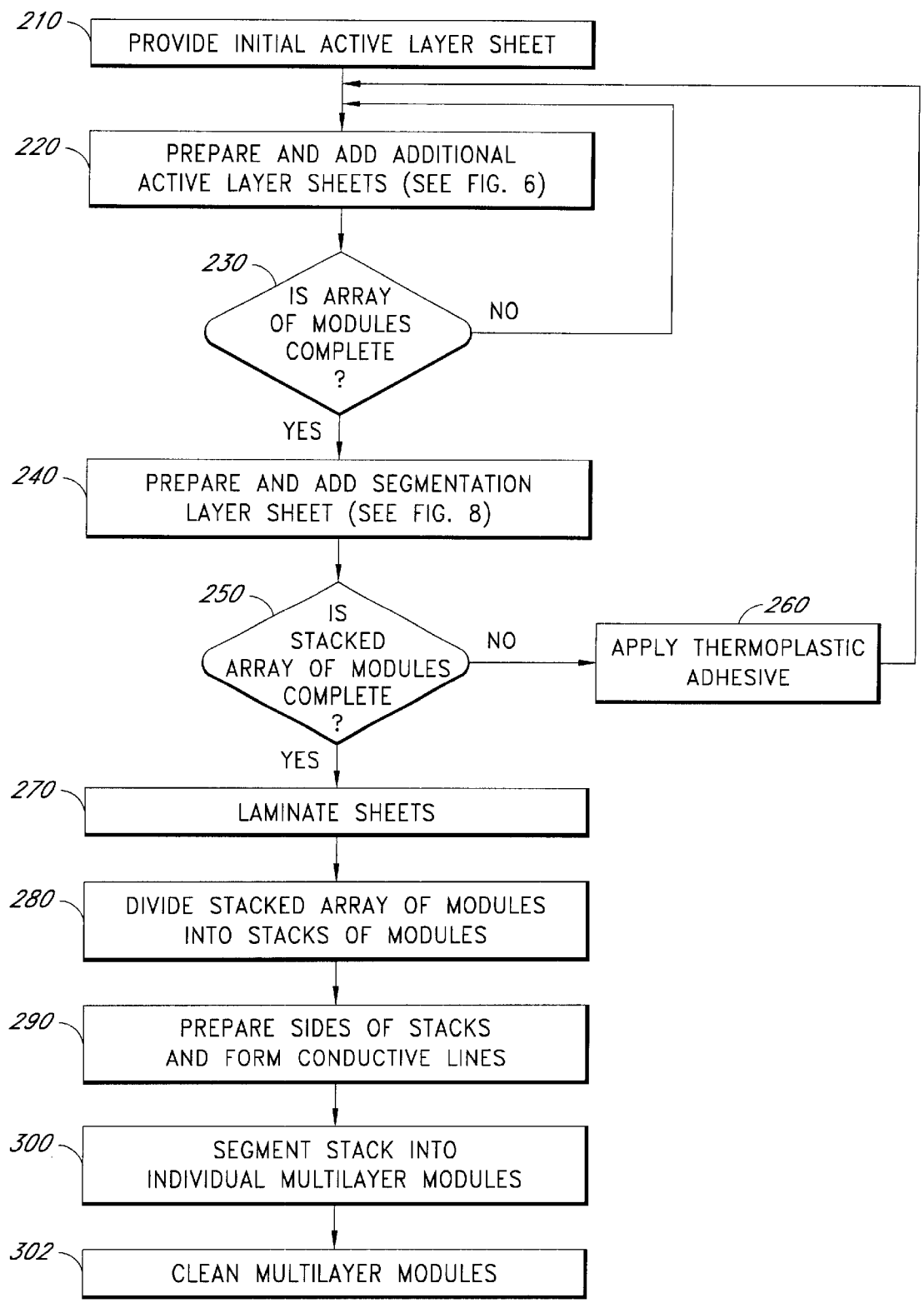
FIG. 3 is a flowchart describing a method of fabricating multilayer modules compatible with an embodiment of the invention.
Figure 4:
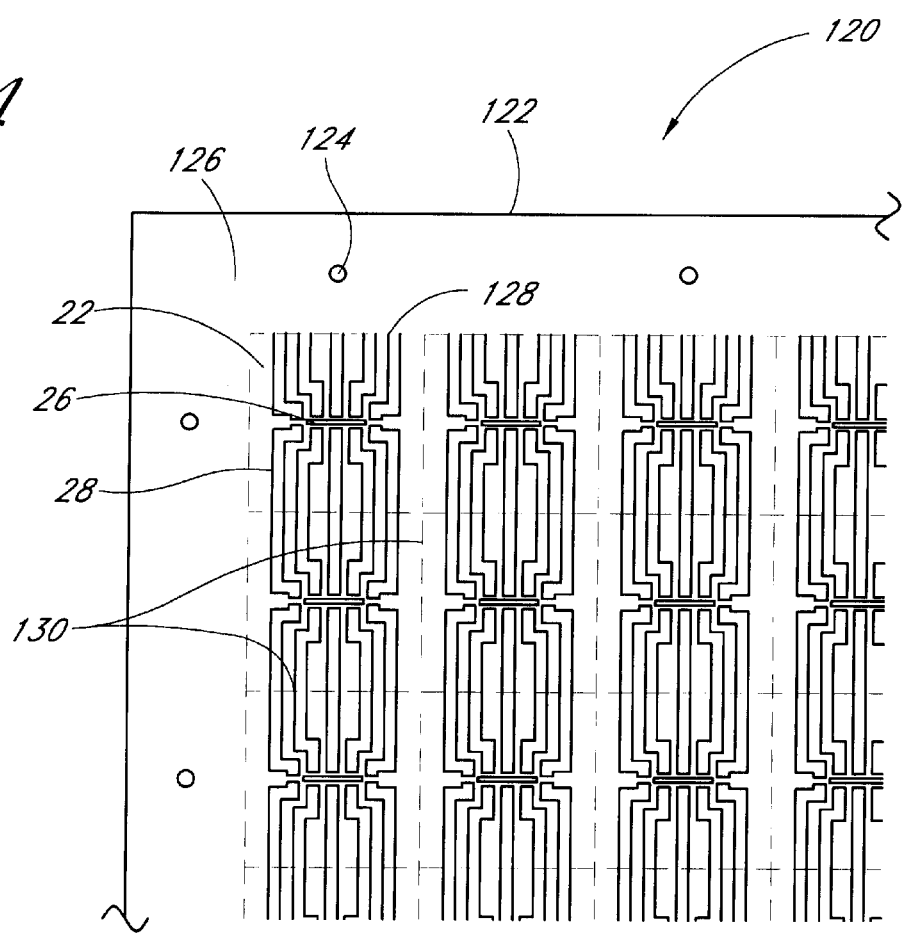
FIG. 4 schematically illustrates a portion of an active layer sheet compatible with an embodiment of the invention.

FIG. 3 is a flowchart describing a method 200 of fabricating multilayer modules 10 compatible with an embodiment of the invention. FIG. 3 makes reference to the structures schematically illustrated in FIGS. 1 and 2, as well as the structures schematically illustrated in FIGS. 4, 5, 7, 9, 10, 12–14. A flexible active layer sheet 120 is initially provided in an operational block 210. FIG. 4 schematically illustrates a portion of an active layer sheet 120 compatible with an embodiment of the invention. The active layer sheet 120 comprises a flexible non-electrically-conductive first substrate sheet 122 and a plurality of arrayed active areas 128 with borders between adjacent arrayed active areas 128 defining dicing lines 130. In the embodiment illustrated in FIG. 4, the active layer sheet 120 further comprises a plurality of registration holes 124 within a sheet border 126 extending along at least a portion of the circumference of the active layer sheet 120. Each arrayed active area 128 corresponds to an active layer 20 of a multilayer module 10, and comprises at least one electronic element 26 and a plurality of electrically-conductive traces 28 which provide electrical connection from an edge of the arrayed active area 128 to the electronic element 26. The portion of the first substrate sheet 122 within the arrayed active area 128 corresponds to the non-electrically-conductive first substrate 22 of the multilayer module 10.

As schematically shown in FIG. 4 by dashed lines, the arrayed active areas 128 are conceptually separated by the dicing lines 130. As described more fully below, the active layer sheets 120 will eventually be cut along these dicing lines 130 to form the active layers 20 of the multilayer modules 10. These dicing lines 130 are conceptual, and the active layer sheet 120 does not require actual lines corresponding to the dicing lines 130 to be manifested on the active layer sheet 120.

The dimensions of the active layer sheet 120 are not critical to the invention. In one embodiment, the active layer sheet 120 is approximately 14 inches by 14 inches, is approximately 0.002" thick, and has 169 (13×13) electronic element areas 128 which are each one inch by one inch in area. In the illustrated embodiment, the sheet borders 126 which extend along the whole circumference of the active layer sheet 120 are approximately 0.5 inches wide. Other embodiments compatible with the invention can have active areas 128 with different dimensions and array configurations, and different sheet border 126 dimensions. Furthermore, while the embodiment schematically illustrated in FIG. 4 has square active areas 128, other embodiments can have other shapes, such as rectangular or triangular, which would result in rectangular or triangular multilayer modules 10. In certain embodiments, the active layer sheets 120 are received in sheet form, while in other embodiments, the active layer sheets 120 are cut from a roll of active layer sheets 120.

Figure 5:
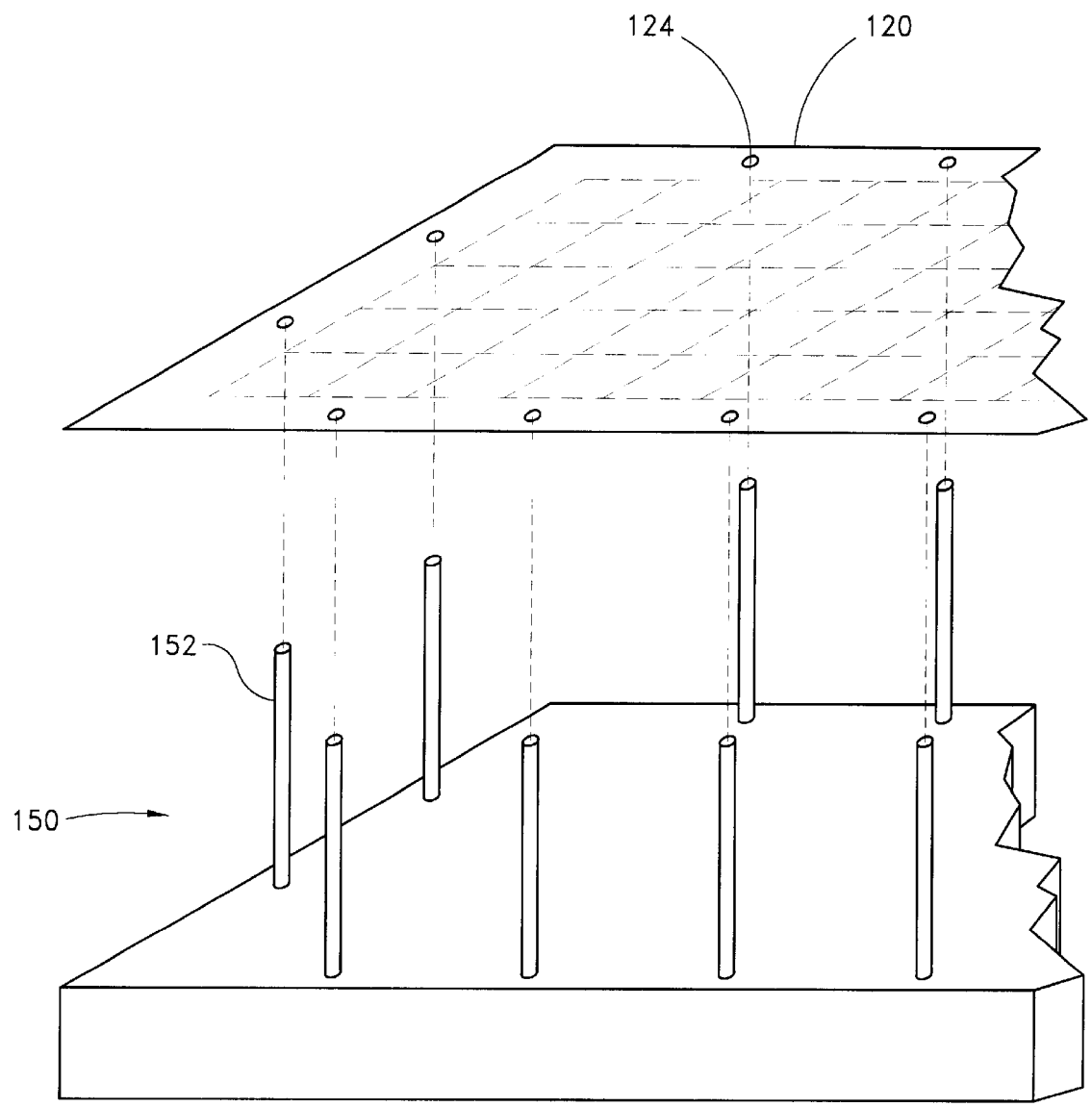
FIG. 5 schematically illustrates a registration tool comprising alignment posts which engage registration holes of the active layer sheets and segmentation layer sheets to align the sheets in preparation of lamination.

The registry of the registration holes 124 with respect to the active areas 128 are substantially consistent for each active layer sheet 120. In certain embodiments, the registration holes 124 are placed along the whole circumference of the active layer sheet 120, while in other embodiments, the registration holes 124 can be placed along only a portion of the circumference of the active layer sheet 120. As schematically illustrated in FIG. 5, by placing the active layer sheets 120 onto the registration tool 150 with the alignment posts 152 engaged with the registration holes 124, the registration holes 124 provide a mechanism to align the various active layer sheets 120 in registry with one another as the arrayed module pre-forms 160 are formed.

Returning to the flowchart of FIG. 3, in an operational block 220, an additional active layer sheet 120' is prepared to be added to the existing active layer sheet 120 on the registration tool 150. The operational block 220 is separated into sub-blocks in the flowchart of FIG. 6. In an operational block 310, an additional active layer sheet 120' is provided. In an operational block 320, the surface of the active layer sheet 120' opposite the electronic element 26' is ashed in preparation of applying an adhesive 50 to the ashed surface. In one embodiment, ashing of a surface comprises placing the active layer sheet 120' in a partial vacuum and exposing the surface opposite the electronic element 26' to a plasma. In this way, the surface of the active layer sheet 120' is activated, thereby strengthening the bond between the surface and the adhesive 50 to be applied. Persons skilled in the art are able to select appropriate sets of parameters such as vacuum pressure, gaseous species, applied voltages, and device configurations to sufficiently ash the surface of the active layer sheet 120' without damaging the electronic element 26' or other features of the active layer sheet 120'. Other embodiments compatible with the invention can utilize other ashing techniques.

In an operational block 330, an adhesive 50 is applied to the ashed surface of the active layer sheet 120' in a uniform, thin layer. In certain embodiments, the adhesive 50 is an epoxy which is applied at room temperature by spraying, roll coating, or other method. Other certain embodiments may utilize an adhesion promoter sprayed onto the ashed surface of the active layer sheet 120' before the adhesive 50 is applied. In certain other embodiments, multiple adhesive compounds may comprise the adhesive 50, and these multiple adhesive compounds may be applied to the active layer sheet 120' as separate steps in the fabrication of the multilayer modules 10. Persons skilled in the art are able to select an appropriate adhesive 50 and method of applying the adhesive 50 to the ashed surface of the active layer sheet 120'. Persons skilled in the art can also appreciate that the adhesive 50 can be applied to the surface of the existing active layer sheet 120 which is to be bonded to the ashed surface of the additional active layer sheet 120', without loss of generality.

In an operational block 340, the active layer sheet 120' is heated to drive off the solvents from the adhesive 50 and to densify the adhesive 50. This heating is effectively an incomplete curing of the adhesive 50 in order to make subsequent handling of the active layer sheet 120' easier. Persons skilled in the art can select appropriate heating temperatures and times to drive off the solvents and densify the adhesive 50 without damaging the electronic element 26' of the active layer sheet 120'.

In an operational block 350, the active layer sheet 120' is stacked onto the existing active layer sheet 120 in the registration tool 150. By engaging the registration holes 124' of the additional active layer sheet 120' with the alignment posts 152 of the registration tool 150, the traces 28, 28' of the two active layer sheets 120, 120' can be positioned in registry with one another, in preparation for the formation of the electrically-conductive lines 32 along the sides 30 of the multilayer modules 10. The process illustrated in the operational block 220 of FIGS. 3 and 6 continues until the desired number of active layer sheets 120 for an arrayed module pre-form 160 are prepared and stacked in the registration tool 150. This determination of whether the desired number of active layer sheets 120 have been prepared and added is illustrated in FIG. 3 as the decision block 230.

Figure 7:
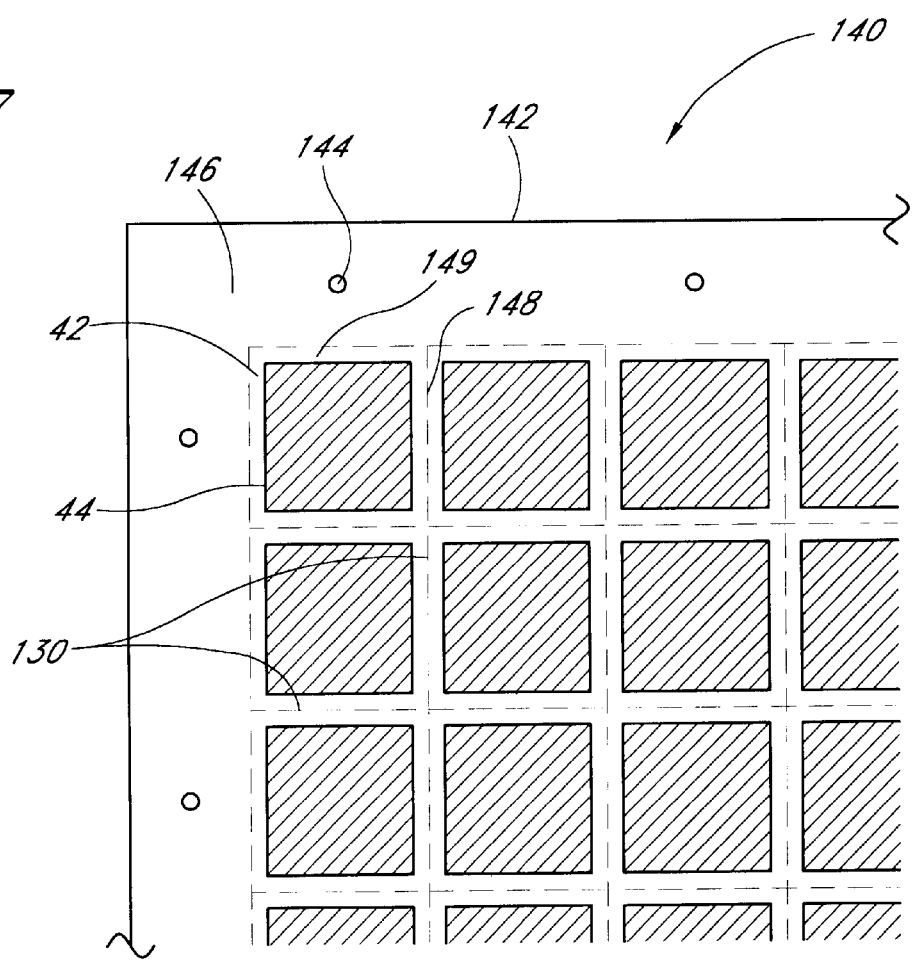
FIG. 7 schematically illustrates a portion of a segmentation layer sheet compatible with an embodiment of the invention.

In an operational block 240 of the flowchart of FIG. 3, a segmentation layer sheet 140 is prepared and stacked with the active layer sheets 120 in the registration tool 150. FIG. 7 schematically illustrates a portion of a segmentation layer sheet 140 compatible with an embodiment of the invention. The segmentation layer sheet 140 comprises a flexible non-electrically-conductive second substrate sheet 142 and a plurality of arrayed segmentation areas 148 with borders between adjacent arrayed segmentation areas 148 defining dicing lines 130. In the embodiment schematically illustrated in FIG. 7, the segmentation layer sheet 140 further comprises a plurality of registration holes 144 within a sheet border 146 extending along at least a portion of the circumference of the segmentation layer sheet 140. Each segmentation area 148 comprises a thermally-conductive material 44 and corresponds to a segmentation layer 40 of a multilayer module 10. The portion of the second substrate sheet 142 within the arrayed segmentation area 148 corresponds to the non-electrically-conductive second substrate 42 of the multilayer module 10.

In certain embodiments, the thermally-conductive material 44 of each segmentation area 148 covers most of the corresponding segmentation area 148, but does not extend fully across the segmentation area 148. As schematically shown in FIG. 7, for segmentation areas 148 which have a generally square shape, the thermally-conductive material 44 is also generally square in shape, but does not extend fully across the segmentation area 148, leaving thin regions 149 with no thermally-conductive material 44. Similarly, for segmentation layer sheets 140 with rectangular or triangular segmentation areas 148, there are corresponding thin regions 149 along the borders between adjacent segmentation areas 148 with no thermally-conductive material 44. The thermally-conductive material 44 is also electrically conductive in certain embodiments, so the thin region 149 prevents electrically shorting the lines 32 along the sides 30 of the multilayer modules 10 to each other via the thermally-conductive material 44. In certain embodiments in which the thermally-conductive material 44 is a deposited metal layer such as copper, this configuration is fabricated by depositing an approximately 0.35 mil-thick copper layer across the non-electrically-conductive second substrate sheet 142, and then etching away some of the copper to form copper-free thin regions 149 approximately 10 mils wide along the borders between adjacent segmentation areas 148 corresponding to the segmentation layers 40. Persons skilled in the art are able to select an appropriate method to fabricate a segmentation layer sheet 140 with a configuration compatible with an embodiment of the invention.

As schematically shown in FIG. 7 by dashed lines, the arrayed segmentation areas 148 are conceptually separated by the dicing lines 130. As described more fully below, the segmentation layer sheets 140 will eventually be cut along these dicing lines 130 to form the segmentation layers 40 of the multilayer modules 10. These dicing lines 130 are conceptual only, and the segmentation layer sheet 140 does not require actual lines corresponding to the dicing lines 130 to be manifested on the segmentation layer sheet 140.

The dimensions of the segmentation layer sheet 140 are substantially similar to those of the active layer sheets 120. The segmentation areas 148 of the segmentation layer sheet 140 has the same array pattern as do the active areas 128 of the active layer sheet 120. Similarly, the segmentation layer sheet 140 has the same dimensions and patterns of the sheet borders 146, dicing lines 130, and registration holes 144 as do the active layer sheets 120, so that the dicing lines 130 of the segmentation layer sheet 140 and active layer sheets 120 are in registry with one another in preparation of dicing the active layer sheets 120 and segmentation layer sheets 140 into stacks of multilayer modules 10. In certain embodiments, the segmentation layer sheet 140 can have a different thickness than that of the active layer sheets 120. As with the active layer sheets 120, the segmentation layer sheets 140 can be received in sheet form or cut from a roll of segmentation layer sheets 140.

Figure 6:
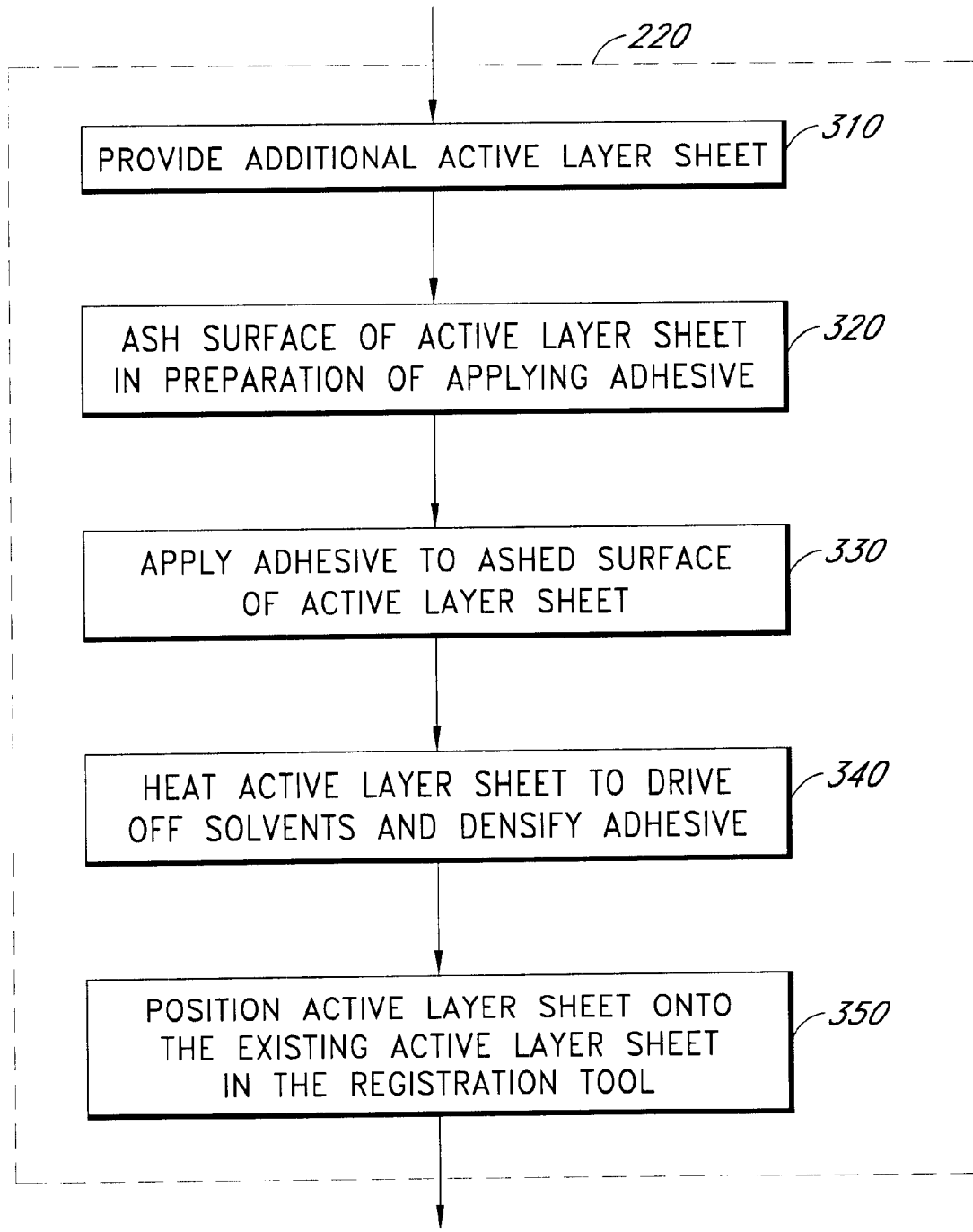
FIG. 6 is a flowchart describing the process of preparing and adding additional active layer sheets.
Figure 8:
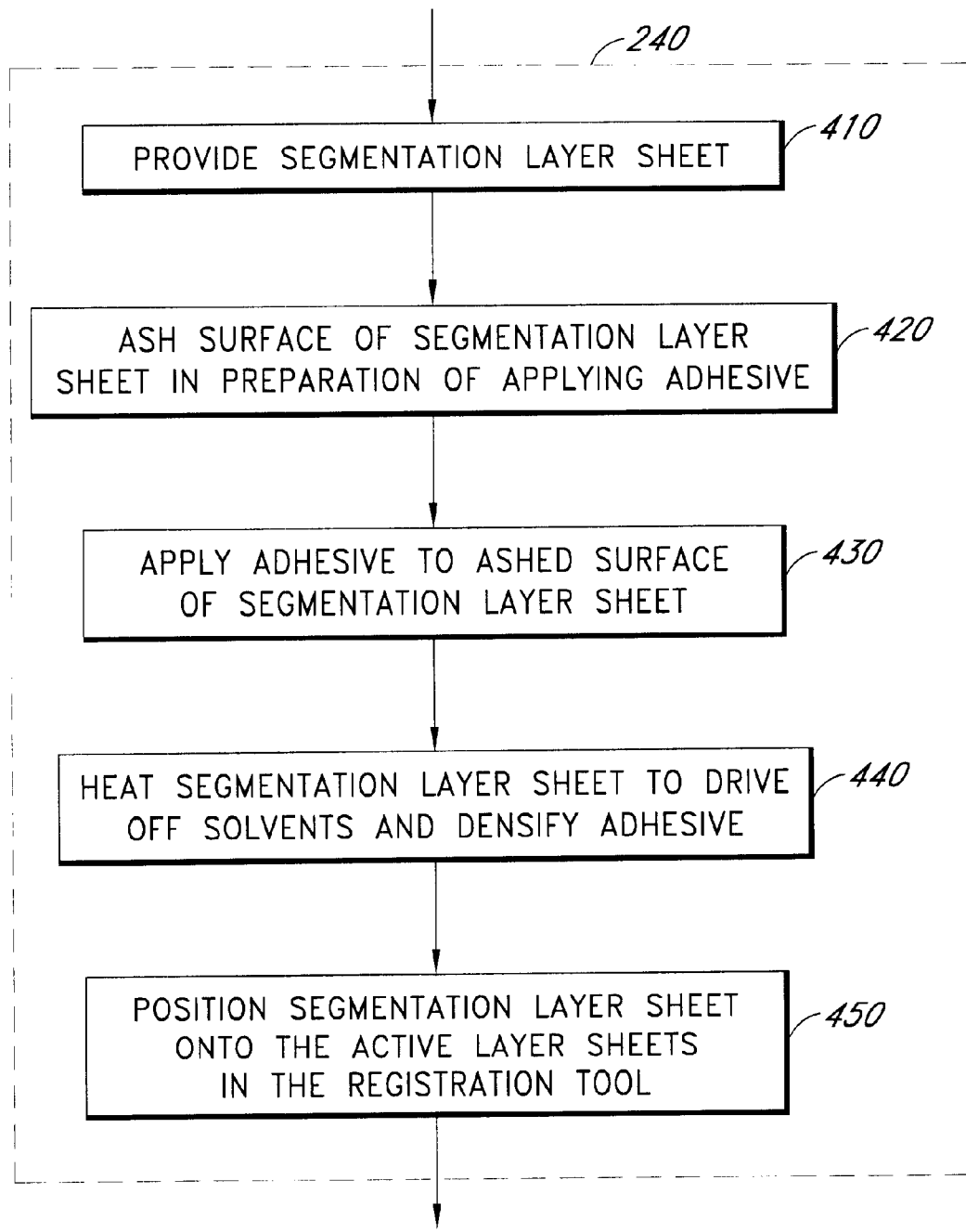
FIG. 8 is a flowchart describing the process of preparing and adding the segmentation layer sheet.

The operational block 240 describing the process of preparing and stacking the segmentation layer sheet 140 is separated into sub-blocks in the flowchart of FIG. 8, which mirrors the flowchart of FIG. 6 for the process of preparing and stacking additional active layer sheets 120. In an operational block 410, a segmentation layer sheet 140 is provided, and in an operational block 420, the surface of the segmentation layer sheet 140 which is opposite the thermally-conductive material 44 is ashed in preparation of applying the adhesive 50. In an operational block 430, the adhesive 50 is applied to the ashed surface of the segmentation layer sheet 140, and in an operational block 440, the segmentation layer sheet 140 is heated to drive off solvents from the adhesive 50 and to densify the adhesive 50. In an operational block 450, the segmentation layer sheet 140 is stacked onto the active layer sheets 120 in the registration tool 150. As described above for the preparation and stacking of additional active layer sheets 120, the preparation and stacking of the segmentation layer sheet 140 can be achieved in various embodiments. In the embodiment described herein, the stacking of the segmentation layer sheet 140 represents the full compilation of all the layers of an arrayed module pre-form 160. As is described below, the formation of the arrayed module pre-forms 160 allows many multilayer modules 10 to be processed concurrently, thereby saving manufacturing costs.

Returning to the flowchart of FIG. 3, in a decision block 250, it is determined whether the registration tool 150 has the desired number of arrayed module pre-forms 160 stacked on top of one another. If the desired number of stacked arrayed module pre-forms 160 has not yet been reached, then in an operational block 260, a thermoplastic adhesive 170 is applied to the segmentation layer sheet 140, and the next arrayed module pre-form 160 is stacked on top of the segmentation layer sheet 140. The thermoplastic adhesive 170 is an adhesive which becomes softer and loses some of its adhesive properties at higher temperatures, thereby allowing the stacked multilayer modules 10 to be subsequently separated from one another, as described more fully below. Examples of thermoplastic adhesive materials compatible with an embodiment of the invention include, but are not limited to, Ultem® which is available from General Electric Structured Products of Pittsfield, Mass., and SumiOxy® which is available from Occidental Chemical Corporation of Grand Island, N.Y. In certain embodiments, the thermoplastic adhesive 170 is applied by roller coating onto the segmentation layer sheet 140, then heating the segmentation layer sheet 140 to drive off solvents. Additionally, in certain other embodiments, the thermoplastic adhesive 170 can be applied onto the segmentation layer sheet 140 before the segmentation layer sheet 140 is added to the active layer sheets 120 in the registration tool 150. In certain embodiments, the thermoplastic adhesive 170 is applied across the entire top side of the segmentation layer sheet 140, while in other embodiments, the thermoplastic adhesive 170 is applied across a portion of the top side of the segmentation layer sheet 140. Persons skilled in the art are able to select appropriate thermoplastic materials and usage parameters compatible with an embodiment of the invention.

Figure 9:
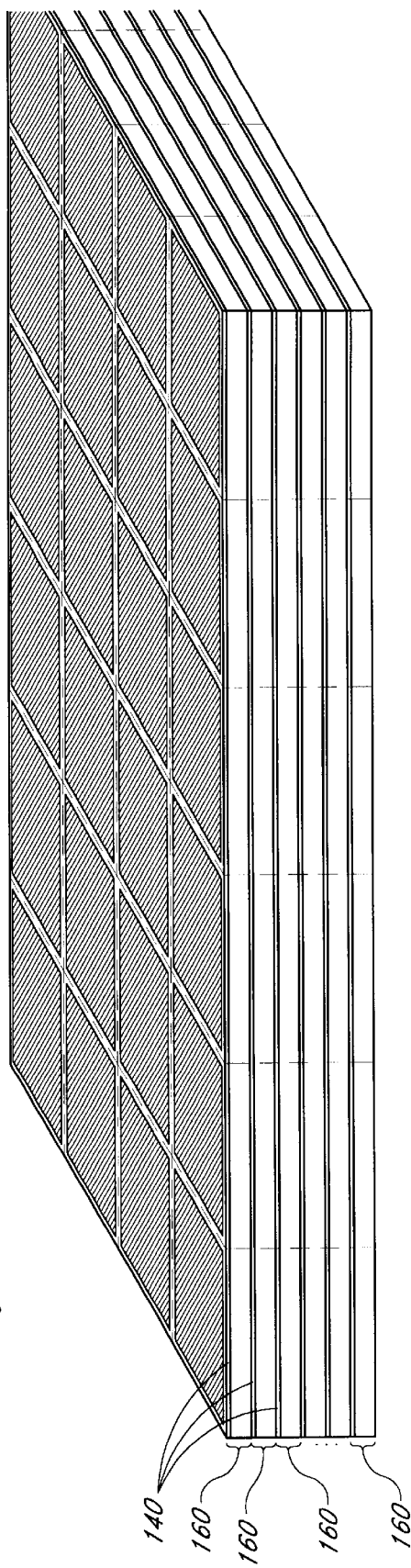
FIG. 9 schematically illustrates a laminated stack of arrays of multilayer modules.

Once the registration tool 150 has the desired number of arrayed module pre-forms 160 stacked on top of one another, thereby forming a stack of arrayed module pre-forms 160, the assembled sheets are laminated together, as signified in FIG. 3 by the operational block 270. In certain embodiments, the sheets in the registration tool 150 are locked in place, pressed together, and healed to an elevated temperature to cure the adhesive 50 between the active layer sheets 120 and segmentation layer sheets 140. The locking of the layers in the registration tool 150 can be achieved by using suction. Alternatively, the locking and heating of the layers can be achieved by placing the registration tool 150 in an autoclave. A similar method is used in the printed circuit board industry, and persons skilled in the art are able to select appropriate operational parameters, such as pressure, temperature, and time, to achieve the lamination of the sheets without damaging the stack of arrayed module pre-forms 160. FIG. 9 schematically illustrates the resulting laminated stack 180 of arrayed multilayer modules 10, with the dicing lines 130 shown as dashed lines. In the embodiment illustrated in FIG. 9, each pre-form 160 has a segmentation layer sheet 140 as its top sheet.

Figure 10:
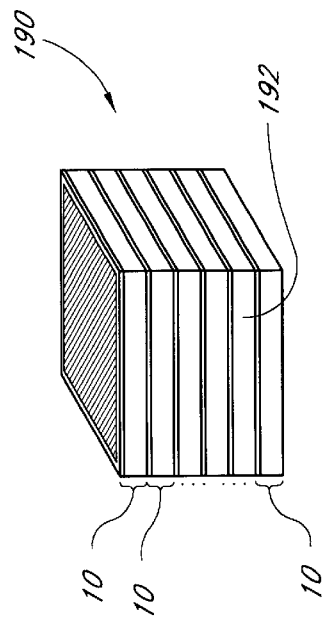
FIG. 10 schematically illustrates an individual stack of multilayer modules obtained after dividing the laminated stack of arrays illustrated in FIG. 9.

In an operational block 280, the laminated stack 180 of arrayed multilayer modules 10 is divided into stacks 190 of individual multilayer modules 10. In certain embodiments, this division is performed by cutting the stack 180 of arrayed multilayer modules 10 along the dicing lines 130, with the cutting performed by a plurality of blades held under tension. In certain embodiments, the cutting is performed while the stack 180 of arrayed multilayer modules 10 is held onto the registration tool 150, while in other embodiments, the stack 180 of arrayed multilayer modules 10 is removed from the registration tool 150 before cutting. FIG. 10 schematically illustrates a resulting stack 190 of individual multilayer modules 10 obtained after dividing the stack 180 of arrayed multilayer modules 10 illustrated in FIG. 9. The sides 192 of the stack 190 of individual multilayer modules 10 are formed by the edges of the active areas 128 and segmentation areas 148. The processing of the stacks 190 of multilayer modules 10, e.g., metallization and laser ablating, can be done more simply and efficiently than for the stacks 190 rather than for the multilayer modules 10 individually.

Figure 11:
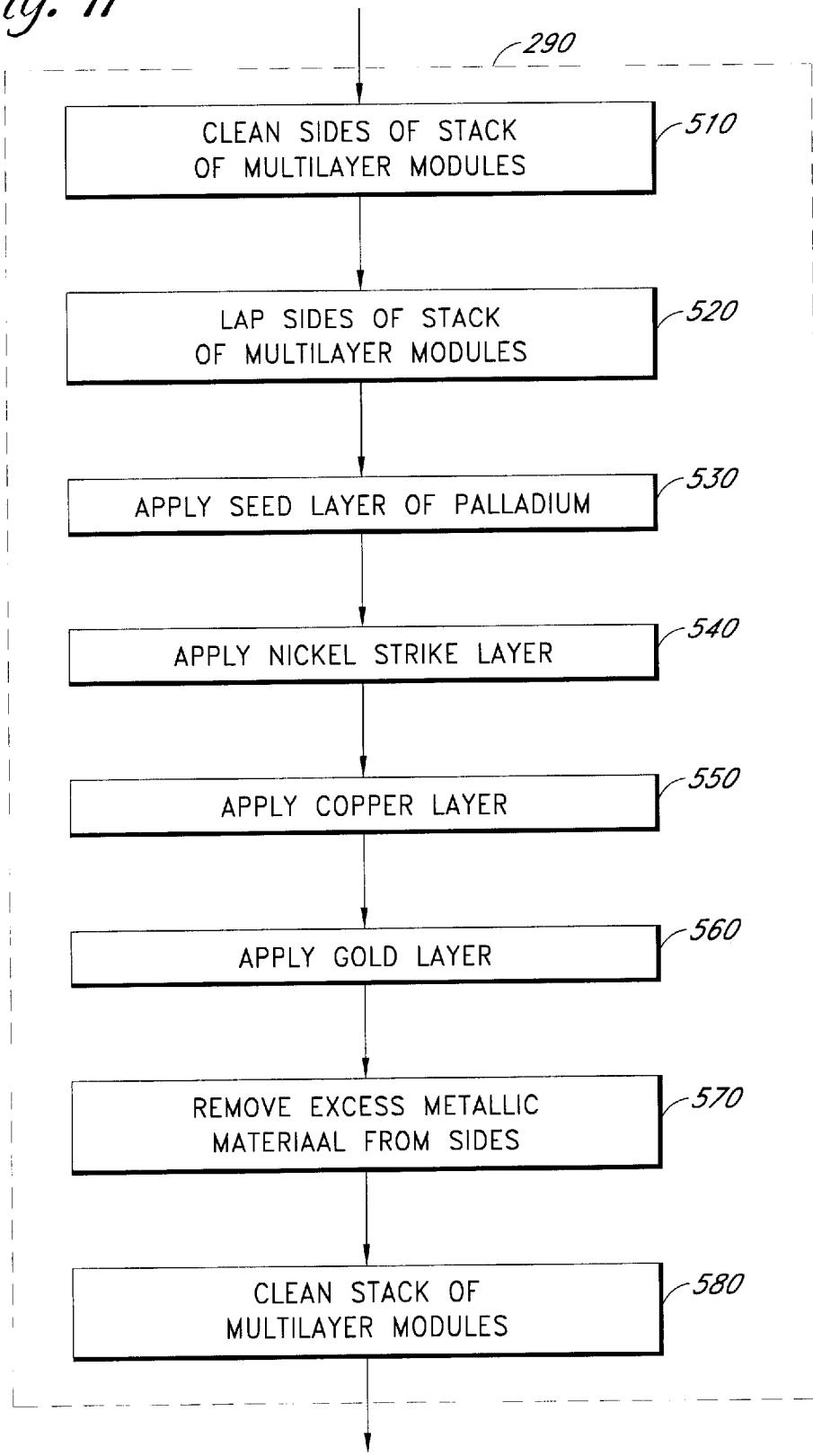
FIG. 11 is a flowchart describing the process of preparing the sides of the stack of multilayer modules and forming electrically-conductive lines along the sides.

Returning to the flowchart of FIG. 3, in an operational block 290, the sides 192 of the stack 190 of multilayer modules 10 are prepared and electrically-conductive lines 32 are formed along at least one side 192 of the stack 190 of multilayer modules 10. The operational block 290 is separated into sub-blocks in the flowchart of FIG. 11. In an operational block 510, the sides 192 of the stack 190 of multilayer modules 10 are cleaned by soaking in a cleaning solution.

In an operational block 520, the sides 192 of the stack 190 of multilayer modules 10 are then lapped to remove excess material, to desmear the material from the sides 192 which was smeared by the cutting process, and to make the sides 192 more smooth. The lapping indicated by the operational block 520 also ensures that the electrically-conductive traces 28 of the active layers 20 are exposed on the sides 192 of the stack 190 of multilayer modules 10. Persons skilled in the art are able to select an appropriate method of lapping the sides 192 of the stack 190 of multilayer modules 10 compatible with an embodiment of the invention.

In an operational block 530, a seed layer of palladium is applied to the sides 192 of the stack 190 of multilayer modules 10. One technique compatible with an embodiment of the invention for seeding is barrel plating the stack 190 of multilayer modules 10 using a bath of a palladium-containing solution. This technique, based on standard through-hole plating technology, results in a thin layer of palladium deposited onto the sides 192 of the stack 190. Persons skilled in the art can select an appropriate method of seeding palladium compatible with an embodiment of the invention.

In an operational block 540, a thin strike layer of nickel is barrel plated onto the sides 192 of the stack 190 of multilayer modules 10 by an electroless plating process. In certain embodiments, the nickel strike layer is approximately 0.01 mils thick, while in other embodiments, the nickel strike layer is not used. Nickel is used in the strike layer because electroless copper has been observed to cause some reaction at the interfaces between the active layers 20, thereby reducing the adhesion between these layers.

Figure 12:
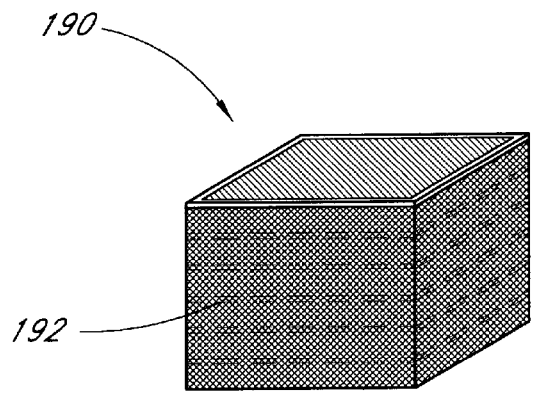
FIG. 12 schematically illustrates the stack of multilayer modules after the sides have been metallized.

In an operational block 550, a thin layer of copper is barrel plated onto the nickel strike layer by an electroless plating process. In certain embodiments, the copper layer is approximately 0.15 mils thick. In embodiments in which the nickel strike layer is not used, the copper layer is plated onto the sides 192 of the stack 190 of multilayer modules 10. In an operational block 560, a thin layer of gold is plated onto the copper layer by an electroless plating process. In certain embodiments, the gold layer is approximately 0.005 mils thick. Gold is solderable and is used to protect the copper layer from oxidizing, thereby becoming less conductive. The resulting structure after these metallization procedures is schematically illustrated in FIG. 12, in which the stack 190 of multilayer modules 10 is shown to have metallization on all four sides 192.

Figure 13:
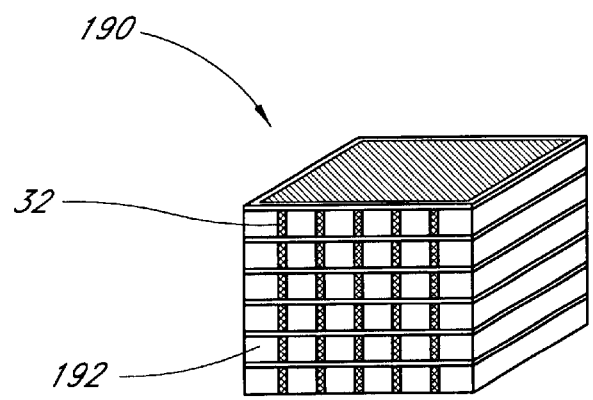
FIG. 13 schematically illustrates the stack of multilayer modules after the excess metallization has been removed, leaving the electrically-conductive lines.

In an operational block 570, the stack 190 of multilayer modules 10 has excess metallic material removed from the sides 192 of the stack 190. In certain embodiments, this removal of excess metallic material is performed by placing the stack 190 in a holding fixture and laser ablating the excess material away from the four sides 192. The remaining metallic material corresponds to the electrically-conductive lines 32 on the sides 30 of the multilayer modules 10 which provide electrical connection to the traces 28 of the active layers 20. The laser ablation is followed by a cleaning process, as indicated in the operational block 580. The resulting structure is schematically illustrated in FIG. 13.

Figure 14:
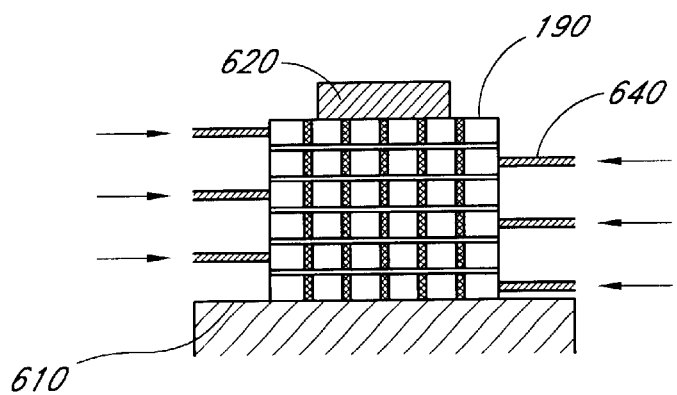
FIG. 14 schematically illustrates the stack of multilayer modules in position within a segmentation tool prior to segmenting the stack into individual multilayer modules.

Returning to the flowchart of FIG. 3, in an operational block 300, the stack 190 of multilayer modules 10 is segmented into individual multilayer modules 10. As schematically illustrated in FIG. 14, in certain embodiments, the stack 190 of multilayer modules 10 is placed in a segmentation tool 600 which comprises a fixture surface 610, a stop 620, a plurality of heating elements 630, and a plurality of pushers 640. The stack 190 of multilayer modules 10 is placed against the fixture surface 610 of the segmentation tool 600 and the position of the stop 620 is adjusted to hold the stack 190 in place. The plurality of heating elements 630 is configured on one side of the stack 190, and the plurality of pushers 640 are configured on the two sides of the stack 190 which neighbor the side with the heating elements 630, as shown in FIG. 14. The heating elements 630 are positioned to be aligned with the segmentation layers 40 of the multilayer modules 10. The pushers 640 are configured so that one pusher 640 is aligned with each multilayer module 10, and each heating element 630 is aligned with a segmentation layer 40 of a multilayer module 10. In certain embodiments, a single heating element 630 can be used which spans all the segmentation layers 40 of the stack 190. In still other embodiments, multiple heating elements 630 can be positioned on opposite sides of the stack 190 to produce more uniform heating of the thermoplastic adhesive 170.

In certain embodiments, a stack 190 is segmented into individual multilayer modules 10 by increasing the temperature of the heating elements 630 to approximately 150° C. The thermally-conductive material 44 of the segmentation layers 40 serves to focus the applied heat from the heating elements 630 to the thermoplastic adhesive 170, thereby softening and releasing the thermoplastic adhesive 170. As used herein, the term "releasing" indicates reducing the adhesive properties of the thermoplastic adhesive 170. The thermally-conductive material 44 allow a lower heat load to be applied, thereby protecting the active layers 20 from excessive heat which may damage the electronic elements 26 or other features of the multilayer modules 10. After an appropriate time for sufficient softening and releasing of the thermoplastic adhesive 170, the pushers 640 on the two sides of the stack 190 are displaced in opposite directions towards the stack 190, thereby displacing the multilayer modules 10 relative to one another in a comb-like manner. In this way, the stack 190 of multilayer modules 10 is segmented into individual multilayer modules 10. Once the segmentation is complete, the individual multilayer modules 10 are cleaned in an operational block 302 to remove the excess thermoplastic adhesive 170.

Other embodiments compatible with the invention can have a segmentation layer 40 as the bottom layer 14 of the multilayer module 10. In such an embodiment, the stacking of the sheets comprising an arrayed module pre-form 160 begins by preparing a segmentation layer sheet 140 and placing it onto the registration tool 150. After applying adhesive 50, the next active layer sheet 120 is stacked onto the surface of the segmentation layer sheet 140 opposite the thermally-conductive material 44. The subsequent active layer sheets 120 are added as described above. Furthermore, the thermoplastic adhesive 170 is applied to the last active layer sheet 120 of an arrayed module pre-form 160 and the next segmentation layer sheet 140 would then be positioned with its thermally-conductive material 44 in contact with the thermoplastic adhesive 170. Using these procedures along with the procedures described above, multilayer modules 10 with segmentation layer 40 as the bottom layer 14 are formed.

In still other embodiments compatible with the invention, multilayer modules 10 are formed with segmentation layers 40 as both the top layer 12 and bottom layer 14. Such multilayer modules 10 can utilize the segmentation layers 40 as moisture barriers to protect the active layers 20 of the multilayer module 10. In such embodiments, the stacked multilayer modules 10 have two layers of thermally-conductive material 44 between the multilayer modules 10. Persons skilled in the art can select appropriate stacking orders of the active layer sheets 120, segmentation layer sheets 140, adhesive 50, and thermoplastic adhesive 170 guided by the description herein to fabricate multilayer modules 10 with segmentation layers 40 in the desired locations.

This invention may be embodied in other specific forms without departing from the essential characteristics as described herein. The embodiments described above are to be considered in all respects as illustrative only and not restrictive in any manner. The scope of the invention is indicated by the following claims rather than by the foregoing description. Any and all changes which come within the meaning and range of equivalency of the claims are to be considered within their scope.

What is claimed is:

1. A stack of multilayer modules with a segmentation layer disposed between neighboring multilayer modules, the segmentation layer facilitating the separation of neighboring multilayer modules, the stack of multilayer modules comprising:

a first multilayer module comprising, a plurality of active layers each comprising a substrate, at least one electronic element, and a plurality of electrically-conductive traces;

a second multilayer module comprising a plurality of active layers each comprising a substrate, at least one electronic element, and a plurality of electrically-conductive traces, the second multilayer module disposed to be neighboring the first multilayer module; and at least one segmentation layer between the first and second multilayer modules, the segmentation layer comprising a metal layer and at least one thermoplastic adhesive layer wherein when heat is applied, the metal layer conducts heat to the thermoplastic adhesive layer.

2. The stack of multilayer modules of claim 1, wherein the metal layer comprises copper or aluminum.

3. A method of releasably adhering together neighboring multilayer modules of a stack of multilayer modules, the method comprising:

providing a first multilayer module comprising a plurality of active layers each comprising a substrate, at least one electronic element, and a plurality of electrically-conductive traces;

providing a second multilayer module comprising a plurality of active layers each comprising a substrate, at least one electronic element, and a plurality of electrically-conductive traces, the second multilayer module disposed to be neighboring the first multilayer module; and disposing a segmentation layer between the first multilayer module and second multilayer module, the segmentation layer comprising a metal layer and a thermoplastic adhesive layer wherein when heat is applied, the metal layer conducts heat to the thermoplastic adhesive layer.

4. A stack of multilayer modules, each multilayer module having a plurality of layers wherein each layer has a substrate therein, the stack of multilayer modules comprising:

a first multilayer module comprising a first layer having a top side and bottom side, the first layer comprising a substrate, at least one electronic element, and a plurality of electrically-conductive traces;

a second multilayer module comprising a second layer having a top side and bottom side, the second layer comprising a substrate, at least one electronic element, and a plurality of electrically-conductive traces; and a metal layer disposed between and adhered to the top side of the first layer and the bottom side of the second layer.

5. The stack of multilayer modules of claim 4, further comprising a thermoplastic adhesive which releasably adheres the first multilayer module to the second multilayer module.

6. The stack of multilayer modules of claim 4, wherein the metal layer comprises copper or aluminum.

7. A method of providing a stack of multilayer modules, each multilayer module having a plurality of layers wherein each layer has a substrate therein, the method comprising:

providing a first multilayer module comprising a first layer having a top side and bottom side, the first layer comprising a substrate, at least one electronic element, and a plurality of electrically-conductive traces;

providing a second multilayer module comprising a second layer having a top side and bottom side, the second layer comprising a substrate, at least one electronic element, and a plurality of electrically-conductive traces;

adhering a metal layer to the top side of the first layer and the bottom side of the second layer; and releasably adhering the first multilayer module to the second multilayer module with the metal layer disposed between the first multilayer module and the second multilayer module.

8. A stack of multilayer modules with a segmentation layer disposed between neighboring multilayer modules, the segmentation layer facilitating the separation of neighboring multilayer modules, the stack of multilayer modules comprising:

a first multilayer module comprising a plurality of active layers each comprising a substrate, at least one electronic element, and a plurality of electrically-conductive traces;

a second multilayer module comprising a plurality of active layers each comprising a substrate, at least one electronic element, and a plurality of electrically-conductive traces, the second multilayer module disposed to be neighboring the first multilayer module; and at least one segmentation layer between the first and second multilayer modules, the segmentation layer comprising a plurality of metal layers and at least one thermoplastic adhesive layer wherein when heat is applied, the metal layers conducts heat to the thermoplastic adhesive layer.

9. A method of providing a stack of multilayer modules with a segmentation layer disposed between neighboring multilayer modules, the method comprising:

providing a first multilayer module comprising a plurality of active layers each comprising a substrate, at least one electronic element, and a plurality of electrically-conductive traces;

providing a second multilayer module comprising a plurality of active layers each comprising a substrate, at least one electronic element, and a plurality of electrically-conductive traces, the second multilayer module disposed to be neighboring the first multilayer module; and releasably adhering the first multilayer module and the second multilayer module by disposing at least one segmentation layer between the first and second multilayer modules, the segmentation layer comprising a plurality of metal layers and at least one thermoplastic adhesive layer wherein when heat is applied, the metal layers conducts heat to the thermoplastic adhesive layer.

10. A stack of multilayer modules with a segmentation layer disposed between neighboring multilayer modules, the segmentation layer facilitating the separation of neighboring multilayer modules, the stack of multilayer modules comprising:

a first multilayer module comprising a first active layer comprising a substrate, at least one electronic element, and a plurality of electrically-conductive traces;

a second multilayer module comprising a second active layer comprising a substrate, at least one electronic element, and a plurality of electrically-conductive traces, the second active layer disposed to be neighboring the first active layer; and at least one segmentation layer between the first and second active layers, the segmentation layer comprising a metal layer and at least one thermoplastic adhesive layer wherein when heat is applied, the metal layer conducts heat to the thermoplastic adhesive layer.

* * * * *